(12) United States Patent
Georgakos

(10) Patent No.: US 7,027,287 B2
(45) Date of Patent: Apr. 11, 2006

(54) STORAGE CAPACITOR WITH HIGH MEMORY CAPACITY AND LOW SURFACE AREA

(75) Inventor: Georg Georgakos, Fraunberg (DE)

(73) Assignee: Infineon Technologies AG, Munich (DE)

( * ) Notice: Subject to any disclaimer, the term of this patent is extended or adjusted under 35 U.S.C. 154(b) by 46 days.

(21) Appl. No.: 10/766,689

(22) Filed: Jan. 28, 2004

(65) Prior Publication Data
US 2004/0190219 A1 Sep. 30, 2004

(30) Foreign Application Priority Data
Jan. 30, 2003 (DE) ................. 103 03 738

(51) Int. Cl.
*H01G 4/005* (2006.01)

(52) U.S. Cl. ............... 361/303; 361/301.4; 361/305; 361/311; 361/313; 361/328; 438/240; 438/253; 438/254

(58) Field of Classification Search ........... 361/303, 361/304, 305, 301.4, 306.3, 311, 313, 321.4, 361/328; 438/240, 253, 254; 257/306, 307
See application file for complete search history.

(56) References Cited

U.S. PATENT DOCUMENTS

| | | | | |
|---|---|---|---|---|
| 5,208,725 A | * | 5/1993 | Akcasu | 361/313 |
| 5,583,359 A | * | 12/1996 | Ng et al. | 257/306 |
| 5,742,472 A | * | 4/1998 | Lee et al. | 361/321.4 |
| 5,978,206 A | * | 11/1999 | Nishimura et al. | 361/303 |
| 6,258,656 B1 | * | 7/2001 | Lange et al. | 438/240 |
| 6,262,450 B1 | * | 7/2001 | Kotecki et al. | 257/306 |
| 6,297,524 B1 | * | 10/2001 | Vathulya et al. | 257/303 |
| 6,407,907 B1 | * | 6/2002 | Ahiko et al. | 361/306.3 |
| 6,452,250 B1 | * | 9/2002 | Buynoski | 257/532 |
| 2002/0191455 A1 | * | 12/2002 | Richter et al. | 365/200 |

FOREIGN PATENT DOCUMENTS

WO    01/99163 A2    12/2001

* cited by examiner

*Primary Examiner*—Nguyen T. Ha
(74) *Attorney, Agent, or Firm*—Dicke, Billig & Czaja, PLLC

(57) ABSTRACT

A storage capacitor includes at least one first electrode adjacent to at least one second electrode, whereby a lateral capacity is formed between these electrodes. The electrodes include stacks of metal parts and connecting contact elements. The second electrodes can be arranged around the first electrodes, and at least some of the second electrodes can be used jointly with adjacent ones of the first electrodes to form adjacent storage capacitors.

20 Claims, 3 Drawing Sheets

FIG 3A
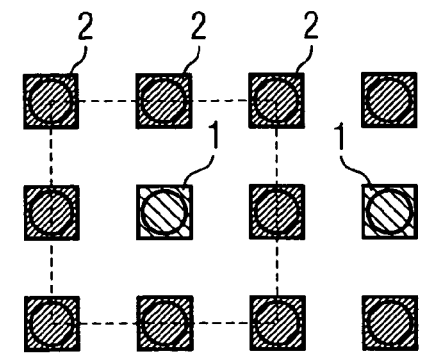
FIG. 3B
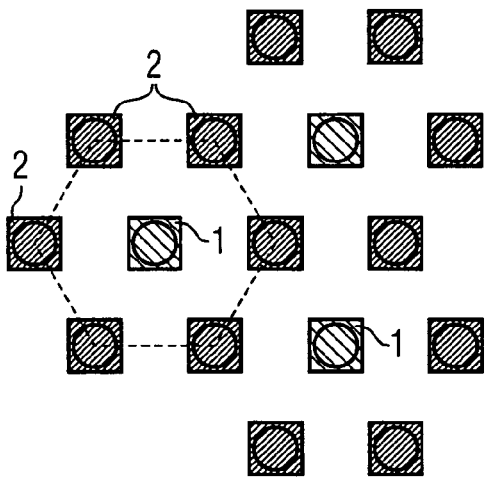
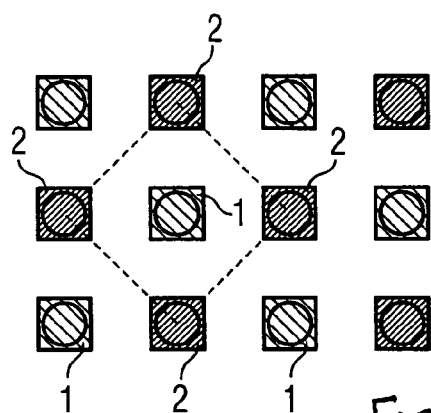
FIG. 3C
FIG 4A
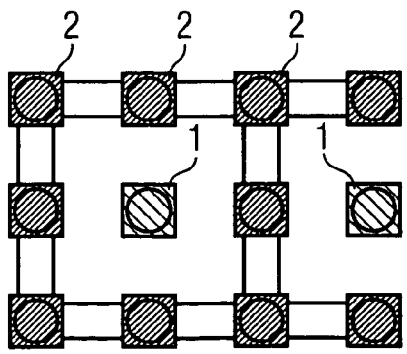
FIG. 4B
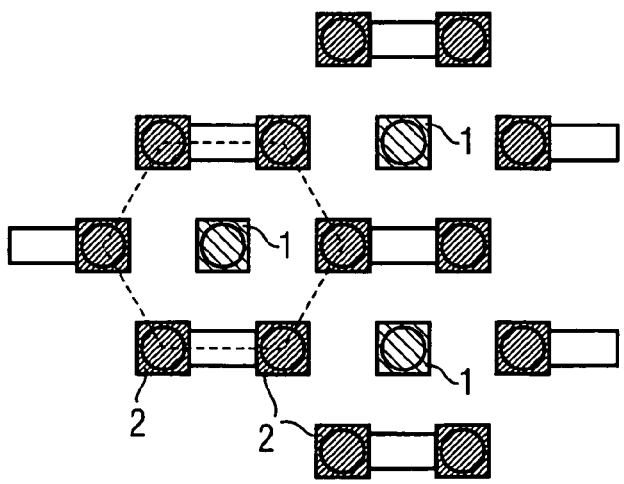

STORAGE CAPACITOR WITH HIGH MEMORY CAPACITY AND LOW SURFACE AREA

FIELD OF THE INVENTION

The present invention relates to a storage capacitor, in particular one that can be used for 1T-, 2T- and 3T-memory cells in, for example, system-on-chip applications, which provides the highest possible capacity with low surface area usage.

BACKGROUND OF THE INVENTION

In dynamic RAM memories, the information to be stored by a memory cell is generally held on a capacitor known as a storage capacitor. In system-on-chip applications in a pure logic technology, storage capacitors are often created by means of the gate capacity of an MOS transistor (e.g. a MoSyS-1T-SRAM, a 1T-cell of a static random access memory from MoSys Inc.) or by means of connection in parallel of gate and diffusion capacity (e.g. IFX-2T concept, a 2T-cell concept from Infineon).

Because of the leakage currents, a storage capacitor slowly loses its charge which can lead to the loss of the information stored on the capacitor. In order to counter this, in microelectronic circuits the charge of all storage capacitors is refreshed again at certain intervals, so that the information is retained. This interval depends, amongst other things, on the size of the memory capacity.

As a result of increasing integration the leakage currents in the abovementioned system-on-chip applications are becoming ever greater and new leakage current sources such as the gate leakage currents are arising due to the increasingly thin oxide coatings. The total memory capacity is also becoming smaller.

An object of the invention is to provide a storage capacitor with the highest possible memory capacity and the lowest possible surface area usage, which in particular in a pure logic technology can be created without additional, and thus more expensive, process steps.

SUMMARY OF THE INVENTION

Within the context of the present invention, the storage capacitor comprises coupling capacitances of metals. Here, according to the invention, an inner electrode and an outer electrode of the storage capacitor are constructed from stacks enclosing metal pieces and the contact elements connecting these metal pieces. In addition, according to the invention several outer electrodes are grouped around an inner electrode, in order to maximise the capacity for the storage capacitor and to guarantee screening from the adjacent storage capacitors or memory cells.

In a memory cell arrangement, several storage capacitors according to the invention of uniform shape can be arranged next to one another, with joint use being made of the outer electrodes of the adjacent storage capacitors. For production considerations and because of the better screening from adjacent storage capacitors a hexagonal shape is preferred here. All outer electrodes of the memory cell arrangement can be connected together with a further metal part that is applied to a reference potential or a supply voltage.

The present invention is preferably suited to use in microelectronic circuits in order, for example in system-on-chip applications, to create 1T-, 2T- or 3T-memory cells. The invention is obviously not restricted to this preferred area of application, however.

BRIEF DESCRIPTION OF THE DRAWINGS

The present invention will now be explained in more detail with reference to the attached drawing and using preferred embodiments.

FIGS. 3A–3C show examples of even arrangements of outer (second) electrodes and inner (first) electrodes in storage capacitors according to the invention.

FIGS. 4A and 4B show examples of connections between the outer electrodes of adjacent storage capacitors.

DETAILED DESCRIPTION

Figure 1:
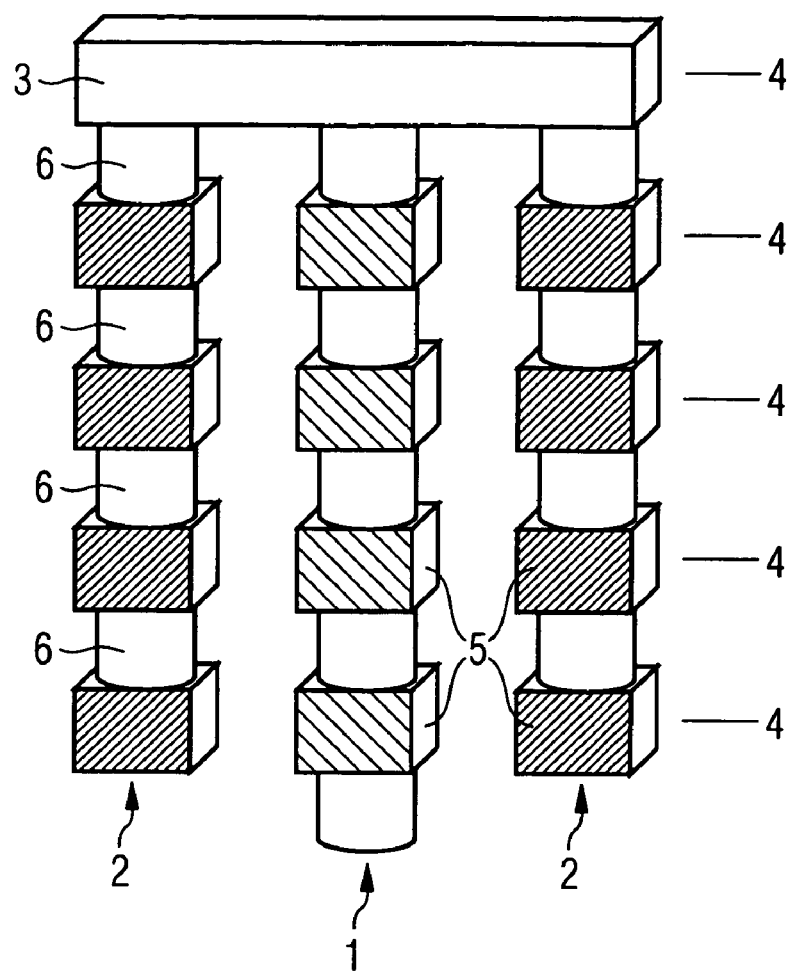
FIG. 1 shows a side view of a storage capacitor according to a preferred embodiment of the invention.

FIG. 1 shows a side view of a storage capacitor with an inner (first) electrode 1 in the centre, two adjacent outer (second) electrodes 2 and a metal part 3 connecting the outer electrodes.

In a manner according to the invention, lateral capacities between adjacent conductors are used to construct the storage capacitor. For this purpose, in each case a stack of metal parts 5 and contact elements 6 connecting these metal parts 5 is constructed, in order to form the corresponding electrode 1 or 2 of the storage capacitor, as shown in FIG. 1. Between a stack and an adjacent stack the desired memory capacity is then created, with the two stacks in particular being arranged in parallel.

When used in microelectronic circuits the metal parts 5 are so-called landing-pads and are each positioned in a metal layer 4. The contact elements 6 connecting the metal parts 5 are so-called vias and are positioned between the metal layers 4.

Advantages of this solution compared with the normal design of a storage capacitor in microelectronic circuits include the reduction in leakage currents within the memory capacity itself, by avoiding MOS or diffusion capacitances, and simple implementation by means of standard metallization in a purely standard CMOS process.

Figure 2:
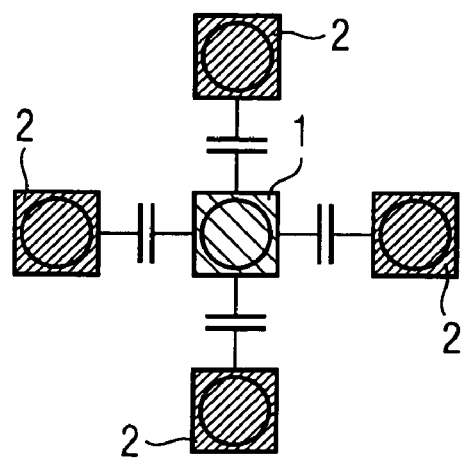
FIG. 2 shows a top view of a storage capacitor according to the invention.

In order to maximise the memory capacity and to guarantee screening from adjacent storage capacitors, several outer electrodes 2 are arranged around an inner electrode 1, as shown by way of example in FIG. 2.

FIG. 2 shows a top view of a storage capacitor according to the invention without metal part with an inner electrode 1 in the centre and four adjacent outer electrodes 2 in the shape of a diamond, indicating the lateral memory capacities between the outer electrodes 2 and the inner electrode 1.

The outer electrodes 2 are connected via contact elements with a metal part 3, which is applied to a reference potential or a supply voltage (see FIG. 1). The inner electrode is coupled with a selection circuit (e.g. a selection transistor) via a contact element.

Several of the storage capacitors described above can be arranged alongside one another to form a memory cell arrangement, with joint use of the outer electrodes being made by the adjacent storage capacitors.

It is, furthermore, possible to assign a storage capacitor not just one inner electrode, but several, which are then connected in parallel by means of separate connections, in order to thereby increase the capacity of the storage capacitor. Essentially, however, the principle according to the invention can be put into practice by just one inner (first) electrode and one outer (second) electrode, each with a stack-like construction as described.

The outer electrodes of a storage capacitor can be arranged in various forms around the corresponding inner electrode. Since in microelectronic circuits as a rule the metal landing-pads are used as a basis for the construction of the stacks described above, a rectangular shape, a diamond shape and a hexagonal shape are the most advantageous shapes. FIGS. 3A–3C show these three most advantageous shapes for an even arrangement of the outer electrodes 2 around inner electrodes 1 in a memory cell arrangement according to the invention.

The three shapes shown in FIGS. 3A–3C differ essentially by the space used. Taking the side length of a landing pad as a reference length A and also selecting the same distance between two adjacent landing-pads, then the necessary relative area for the rectangular shape (FIG. 3A) comes to $16A^2$, the relative area for the hexagonal shape (FIG. 3B) comes to $12A^2$ and the relative area for the diamond shape (FIG. 3C) comes to $8A^2$. Because it is easier lithographically and can be created with a higher yield, the hexagonal shape, which in its three-dimensional form looks like a honeycomb, is preferred for production considerations over the other two shapes. In addition, the screening from the adjacent cells is better with the hexagonal shape than with the other shapes.

Through further connections of the outer electrodes, as shown for example in FIGS. 4A and 4B, the capacity of a storage capacitor can be further increased. Here, the connection between adjacent outer electrodes 2 within a storage capacitor can be achieved both in just one of the metal layers 4 and also in several or all metal layers 4. The same applies to a possible connection between storage capacitors arranged adjacently between outer electrodes 2. It is likewise also in principle conceivable to connect in this way several inner electrodes 1 of a storage capacitor.

In microelectronic circuits through the connection of two adjacent outer electrodes, in FIGS. 4A and 4B respectively vertical or horizontal, in each metal layer the storage capacity of the rectangular shape is increased without loss of surface area (see FIG. 4A). Likewise, by connecting two outer, each horizontal, electrodes in each metal layer the memory capacity in the hexagonal shape is increased without loss of surface area (see FIG. 4B). Furthermore, the hexagonal shape has lower surface area usage than the rectangle.

Figure 5A:
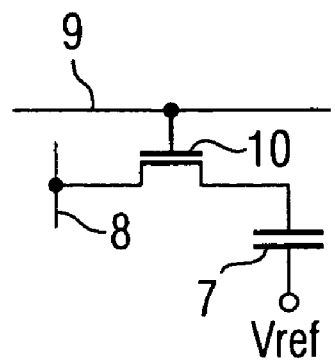
FIGS. 5A–5C show examples of the control of a storage capacitor according to the means of 1T-, 2T- and 3T-memory cells.
Figure 5B:
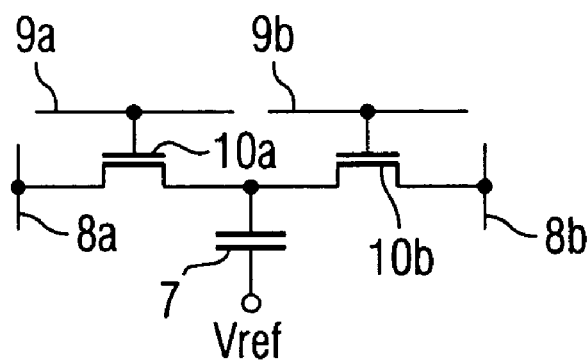
Figure 5C:
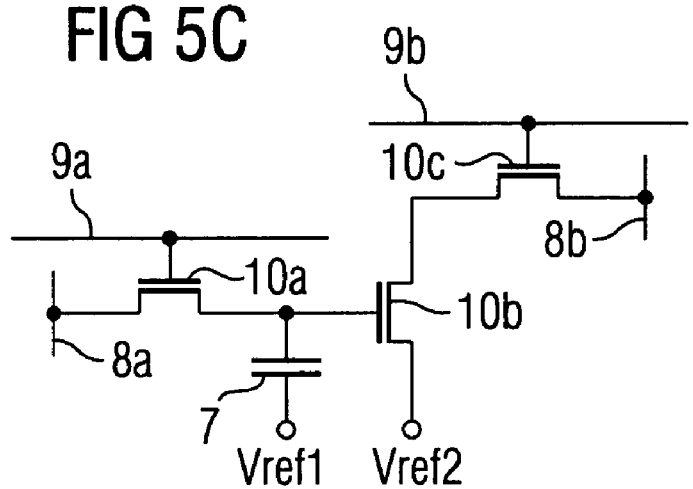

FIGS. 5A–5C shows possible applications of a storage capacitor 7 according to the invention in 1T-, 2T- and 3T-semiconductor memories or corresponding memory cell arrangements.

According to FIG. 5A, the storage capacitor 7 is controlled via its inner electrodes via a selection transistor 10, which in turn is addressed via a bit line 8 and a word line 9. Furthermore, the outer electrodes of the storage capacitor 7 are connected with a reference potential Vref (1T-memory cell concept).

According to FIG. 5B, the storage capacitor is controlled via two selection transistors 10a, 10b. Selection transistor 10a is addressed via a first bit line 8a and a first word line 9a, while selection transistor 10b is addressed via a second bit line 8b and a second word line 9b (2T-memory cell concept). The storage capacitor 7 is connected via its inner electrodes with the two selection transistors 10a, 10b, while the outer electrodes are again applied to the reference potential Vref.

According to FIG. 5C, three transistors 10a, 10b and 10c are used, which are connected to the storage capacitor 7 as shown. The first bit line 8a and first word line 9a assigned to selection transistor 10a serve to write or store information in the storage capacitor 7, which is applied to a first reference potential Vref1. The second bit line 8b and second word line 9b assigned to selection transistor 10c serve to read out the information stored in the storage capacitor. The transistor 10b connecting the storage capacitor 7 with the selection transistor 10c is applied to a second reference potential Vref2 (3T-memory cell concept).

Of course, the connections of the inner and outer electrodes of the storage capacitor to the selection transistor(s) and the reference potential (or the supply potential) can also be swapped over.

Although exemplary embodiments of the invention are described above in detail, this does not limit the scope of the invention, which can be practiced in a variety of embodiments.

What is claimed is:

1. A storage capacitor, comprising:
   at least one first column shaped electrode including a stack of metal parts spaced at intervals from one another, and contact elements connecting respective pairs of the metal parts;
   at least one second column shaped electrode including a stack of metal parts spaced at intervals from one another, and contact elements connecting respective pairs of the metal parts; and
   the at least one first electrode and the at the least one second electrode positioned laterally adjacent one another and cooperable with one another to provide a storage capacitance.

2. The storage capacitor of claim 1, wherein the stack of the at least one first electrode extends substantially parallel to the stack of the at least one second electrode.

3. The storage capacitor of claim 1, including a plurality of the second electrodes positioned laterally adjacent and peripherally around the at least one first electrode.

4. The storage capacitor of claim 3, wherein the second electrodes are substantially evenly distributed peripherally around the at least one first electrode.

5. The storage capacitor of claim 3, wherein the second electrodes are positioned on a rectangle that surrounds the at least one first electrode.

6. The storage capacitor of claim 3, wherein the second electrodes are positioned on a hexagon that surrounds the at least one first electrode.

7. The storage capacitor of claim 3, wherein the second electrodes are positioned on a diamond shape that surrounds the at least one first electrode.

8. The storage capacitor of claim 1, including a plurality of the second electrodes connected together.

9. The storage capacitor of claim 8, including a plurality of the first electrodes connected together.

10. The storage capacitor of claim 8, including a further metal part and further contact elements connecting the further metal part to the second electrodes, the further metal part spaced from the at least one first electrode in a longitudinal direction of the at least one first electrode by a distance corresponding to a thickness of the further contact elements.

11. The storage capacitor of claim 1, wherein the metal parts of the at least one first electrode are positioned in respectively corresponding metal layers in which respectively corresponding metal parts of the at least one second electrode are also respectively positioned.

12. The storage capacitor of claim 1, including a plurality of the second electrodes, the metal parts of each of the second electrodes positioned in respectively corresponding metal layers in which respectively corresponding metal parts of the remaining second electrodes are also respectively positioned, and wherein the metal parts in at least one of the metal layers are connected together.

13. A memory cell arrangement, comprising:
a plurality of memory cells for storage of information, each said memory cell including a storage capacitor; and
each said storage capacitor including at least one first column shaped electrode that includes a stack of metal parts spaced at intervals from one another, and contact elements connecting respective pairs of the metal parts;
each said storage capacitor including at least one second column shaped electrode that includes a stack of metal parts spaced at intervals from one another, and contact elements connecting respective pairs of the metal parts; and
the at least one first electrode and the at the least one second electrode of each said storage capacitor positioned laterally adjacent one another and cooperable with one another to provide a storage capacitance.

14. The memory cell arrangement of claim 13, wherein at least one of the second electrodes is included in adjacent ones of said storage capacitors.

15. The memory cell arrangement of claim 13, including a further metal part connecting all of the second electrodes of all of the storage capacitors to one another.

16. A microelectronic circuit, comprising:
at least one storage capacitor, the at least one storage capacitor including at least one first electrode that includes a stack of metal parts spaced at intervals from one another, and contact elements connecting respective pairs of the metal parts;
the at least one storage capacitor including at least one second electrode that includes a stack of metal parts spaced at intervals from one another, and contact elements connecting respective pairs of the metal parts; and
the at least one first electrode and the at the least one second electrode positioned laterally adjacent one another and cooperable with one another to provide a storage capacitance; a selection circuit coupled to the at least one first electrode of the at least one storage capacitor; and
the at least one second electrode of the at least one storage capacitor adapted for coupling to a predetermined potential.

17. The microelectronic circuit of claim 16, including a memory cell arrangement, said memory cell arrangement including a plurality of said storage capacitors, said storage capacitors forming respective memory cells for storage of information.

18. The microelectronic circuit of claim 16, wherein the stack of the at least one of first electrode is substantially parallel to the stack of the at least one second electrode.

19. The microelectronic circuit of claim 16, wherein a plurality of second electrodes are positioned laterally adjacent and peripherally around the at least one first electrode.

20. The microelectronic circuit of claim 19, wherein each of the plurality of second electrodes include a stack of metal parts spaced at intervals from one another, and contact elements connecting respective pairs of the metal parts.

* * * * *